United States Patent
Aydin et al.

(10) Patent No.: US 10,763,328 B2
(45) Date of Patent: Sep. 1, 2020

(54) EPITAXIAL SEMICONDUCTOR MATERIAL GROWN WITH ENHANCED LOCAL ISOTROPY

(71) Applicant: GLOBALFOUNDRIES Inc., Grand Cayman (KY)

(72) Inventors: Omur Isil Aydin, Dresden (DE); Judson Holt, Ballston Lake, NY (US); Lakshmanan Vanamurthy, Dresden (DE); Tobias Heyne, Dresden (DE); Pei-Yu Chou, Dresden (DE); Cäcilia Brantz, Dresden (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/151,938

(22) Filed: Oct. 4, 2018

(65) Prior Publication Data
US 2020/0111870 A1    Apr. 9, 2020

(51) Int. Cl.
| | |
|---|---|
| H01L 29/08 | (2006.01) |
| H01L 21/84 | (2006.01) |
| H01L 27/12 | (2006.01) |
| H01L 29/04 | (2006.01) |
| H01L 21/02 | (2006.01) |
| H01L 21/265 | (2006.01) |
| H01L 29/167 | (2006.01) |

(52) U.S. Cl.
CPC ...... *H01L 29/0847* (2013.01); *H01L 21/0245* (2013.01); *H01L 21/02499* (2013.01); *H01L 21/02532* (2013.01); *H01L 21/84* (2013.01); *H01L 27/1203* (2013.01); *H01L 29/04* (2013.01); *H01L 21/02579* (2013.01); *H01L 21/26513* (2013.01); *H01L 29/167* (2013.01)

(58) Field of Classification Search
None
See application file for complete search history.

(56) References Cited

U.S. PATENT DOCUMENTS

| | | | | |
|---|---|---|---|---|
| 5,124,272 | A | * | 6/1992 | Saito ............... H01L 21/2254 257/E21.148 |
| 6,235,568 | B1 | * | 5/2001 | Murthy .......... H01L 21/823814 257/E21.634 |
| 8,299,535 | B2 | | 10/2012 | Chan et al. |
| 9,240,454 | B1 | * | 1/2016 | Liu ................. H01L 29/66628 |
| 10,347,762 | B1 | * | 7/2019 | Liu ................. H01L 21/82343 |

(Continued)

*Primary Examiner* — Zandra V Smith
*Assistant Examiner* — Lawrence C Tynes, Jr.
(74) *Attorney, Agent, or Firm* — Thompson Hine LLP; Francois Pagette

(57) ABSTRACT

Structures for a field-effect transistor and methods for fabricating a structure for a field-effect transistor. A first epitaxial layer has a first surface and a second surface inclined relative to the first surface. A surface layer is arranged on the first and second surfaces of the first epitaxial layer. A second epitaxial layer is arranged over the surface layer on the first and second surfaces of the first epitaxial layer. A portion of the first epitaxial layer defines an interface with the surface layer. The portion of the first epitaxial layer contains a first concentration of a dopant. The surface layer contains a second concentration of the dopant that is greater than the first concentration of the dopant in the portion of the first epitaxial layer.

16 Claims, 4 Drawing Sheets

(56) References Cited

U.S. PATENT DOCUMENTS

| | | |
|---|---|---|
| 2007/0215956 A1* | 9/2007 | Tsuchiya ......... H01L 21/823814 |
| | | 257/407 |
| 2011/0316044 A1 | 12/2011 | Chan et al. |
| 2012/0088342 A1* | 4/2012 | Ming .............. H01L 21/823807 |
| | | 438/230 |
| 2012/0146154 A1* | 6/2012 | Itou ................ H01L 21/823807 |
| | | 257/369 |
| 2013/0240989 A1* | 9/2013 | Glass ............... H01L 29/66545 |
| | | 257/335 |
| 2013/0248999 A1* | 9/2013 | Glass ............... H01L 21/28518 |
| | | 257/335 |
| 2015/0206942 A1* | 7/2015 | Glass ................. H01L 29/7833 |
| | | 257/335 |
| 2016/0351566 A1* | 12/2016 | Niimi ............. H01L 21/823418 |
| 2018/0261697 A1* | 9/2018 | Mazzocchi ............. H01L 29/36 |
| 2019/0165143 A1* | 5/2019 | More .................. H01L 29/7851 |
| 2020/0006545 A1* | 1/2020 | Liu ................ H01L 21/823814 |
| 2020/0119195 A1* | 4/2020 | Liu .................. H01L 21/31155 |

\* cited by examiner

EPITAXIAL SEMICONDUCTOR MATERIAL GROWN WITH ENHANCED LOCAL ISOTROPY

BACKGROUND

The invention relates generally to semiconductor devices and integrated circuit fabrication and, in particular, to structures for a field-effect transistor and methods for fabricating a structure for a field-effect transistor.

Complementary-metal-oxide-semiconductor processes may be used to build a combination of p-type and n-type field-effect transistors that are used to construct logic gates and that are also used as active components in other types of circuits, such as switches used in radiofrequency circuits. Field-effect transistors generally include a channel region, a source, a drain, and a gate electrode. When a control voltage exceeding a characteristic threshold voltage is applied to the gate electrode, carrier flow occurs in a channel region between the source and drain to produce a device output current.

Epitaxial semiconductor films may be used to modify the performance of field-effect transistors. For example, an epitaxial semiconductor film can be used to increase the carrier mobility through the channel region by inducing stresses in the channel. For example, in a p-type field-effect transistor, hole mobility can be enhanced by applying a compressive stress to the channel region. One way in which the compressive stress can be applied is by embedding an epitaxial semiconductor material, such as silicon-germanium, at the opposite ends of the channel. The embedded stressors may also operate as a raised source and a raised drain of the field-effect transistor.

The epitaxial semiconductor material of the raised source and drain may be formed by a selective epitaxial growth process in which growth is initiated only from exposed semiconductor surfaces and not from, for example, exposed dielectric surfaces. The selective epitaxial growth process exhibits different growth rates for different crystal planes, which leads to the formation of facets along slow growth planes. For example, the growth rate of epitaxially-grown silicon-germanium in a <100> direction may be greater than the growth rate in a <111> direction, which leads to faceting normal to the <111> direction.

A capping layer of silicon may be formed over the faceted semiconductor material of the raised source and drain. The thickness of the capping layer should be sufficient to promote silicidation in preparation for contact formation. To maintain the selectivity, the process parameters for the epitaxial growth process may be adjusted. However, the adjustments to the process parameters may also result in anisotropic epitaxial growth of the capping layer with a negligible growth rate on the facets, which may lead to the thickness of the capping layer grown on the facets being insufficient to adequately support silicidation.

Improved structures for a field-effect transistor and methods for fabricating a structure for a field-effect transistor are needed.

SUMMARY

In an embodiment of the invention, a structure includes a first epitaxial layer having a first surface and a second surface inclined relative to the first surface, a surface layer on the first surface and the second surface of the first epitaxial layer, and a second epitaxial layer arranged over the surface layer on the first surface and the second surface of the first epitaxial layer. A portion of the first epitaxial layer defines an interface with the surface layer. The portion of the first epitaxial layer contains a first concentration of a dopant. The surface layer contains a second concentration of the dopant that is greater than the first concentration of the dopant in the portion of the first epitaxial layer.

In an embodiment of the invention, a method includes epitaxially growing a first epitaxial layer having a first surface and a second surface inclined relative to the first surface, forming a surface layer on the first surface and the second surface of the first epitaxial layer, and epitaxially growing a second epitaxial layer arranged over the surface layer on the first surface and the second surface of the first epitaxial layer. A portion of the first epitaxial layer defines an interface with the surface layer. The portion of the first epitaxial layer contains a first concentration of a dopant. The surface layer contains a second concentration of the dopant that is greater than the first concentration of the dopant in the portion of the first epitaxial layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
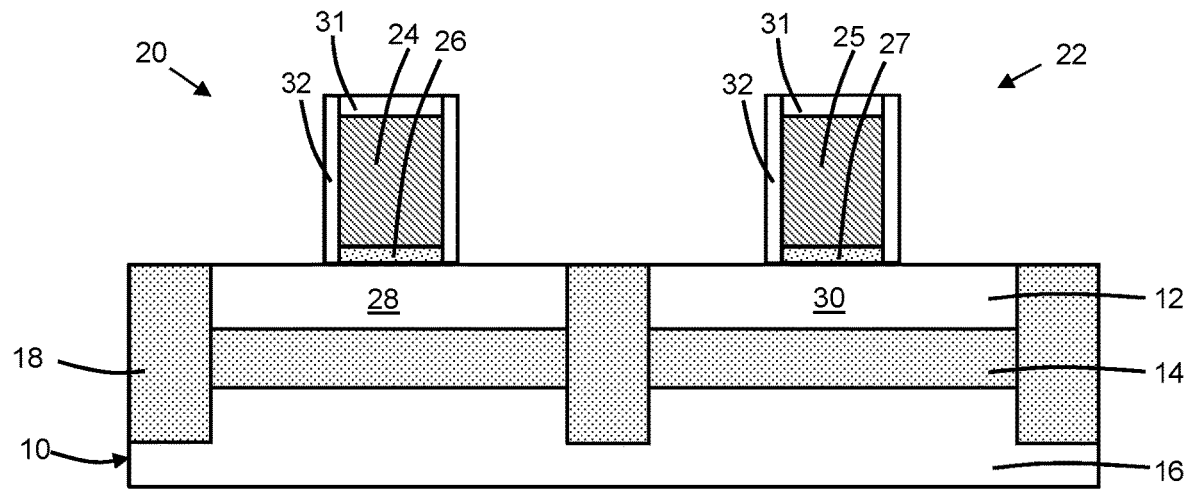
FIGS. 1-4 are cross-sectional views of a structure at successive fabrication stages of a processing method in accordance with an embodiment of the invention.

With reference to FIG. 1 and in accordance with an embodiment of the invention a silicon-on-insulator (SOI) wafer 10 includes a device layer 12, a buried insulating layer 14 that may be composed of an oxide of silicon (e.g., $SiO_2$), and a substrate 16. The device layer 12 and the substrate 16 may be composed of a single-crystal semiconductor material, such as single-crystal silicon. The device layer 12 is separated from the substrate 16 by the intervening buried insulating layer 14 and may be considerably thinner than the substrate 16. The buried insulating layer 14 directly contacts the substrate 16 along an interface and directly contacts the device layer 12 along another interface, and these interfaces are separated by the thickness of the buried insulating layer 14 and may terminate at the outer rim of the SOI wafer 10. The substrate 16 may be lightly doped to have, for example, p-type conductivity.

Trench isolation regions 18 may be formed by a shallow trench isolation (STI) technique that relies on lithography and etching to define trenches in the SOI wafer 10, deposits a dielectric material to fill the trenches, and planarizes and/or recesses the dielectric material. The dielectric material comprising the trench isolation regions 18 may be an oxide of silicon (e.g., silicon dioxide) and/or another electrical insulator deposited by chemical vapor deposition.

Field-effect transistors 20, 22 may be fabricated by complementary metal oxide semiconductor (CMOS) processes during front end of line (FEOL) processing. The field-effect transistor 20 includes a gate structure consisting of a gate electrode 24 and a gate dielectric 26, and the field-effect transistor 22 includes a gate structure consisting of a gate electrode 25 and a gate dielectric 27. The gate structure of field-effect transistor 20 is arranged over a channel region 28, and the gate structure of field-effect transistor 22 is arranged over a channel region 30. The gate electrodes 24, 25 may be composed of a conductor, such as one or more metals or polycrystalline silicon (polysilicon), deposited by physical vapor deposition (PVD), chemical vapor deposition (CVD), etc. The gate dielectrics 26, 27 may be composed of a dielectric material such as silicon dioxide or silicon oxynitride, a high-k dielectric material such as hafnium oxide or hafnium silicate, or layered combinations of these dielectric materials deposited by chemical vapor deposition, atomic layer deposition (ALD), etc. Dielectric caps 31 may be arranged over the gate structures.

Non-conductive spacers 32 are formed on the device layer 12 at the sidewalls of the gate structure of the field-effect transistor 20 and at the sidewalls of the gate structure of the field-effect transistor 22. The non-conductive spacers 32 may be formed by depositing a conformal layer comprised of a dielectric material, such as silicon nitride ($Si_3N_4$) deposited by chemical vapor deposition, and shaping the conformal layer with an anisotropic etching process, such as reactive ion etching, that preferentially removes the dielectric material from horizontal surfaces.

Figure 2:
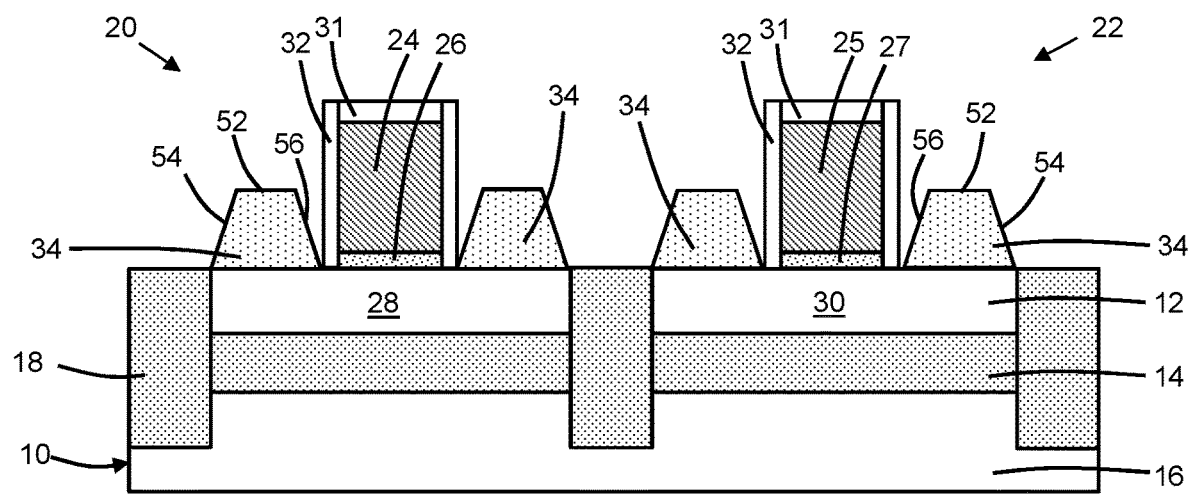

With reference to FIG. 2 in which like reference numerals refer to like features in FIG. 1 and at a subsequent fabrication stage, raised source/drain regions 34 are formed adjacent to the gate electrode 24 and gate dielectric 26 providing the gate structure of the field-effect transistor 20, and raised source/drain regions 34 are also formed adjacent to the gate electrode 25 and gate dielectric 27 providing the gate structure of the field-effect transistor 22. The raised source/drain regions 34 are composed of an epitaxial semiconductor material that is grown by an epitaxial growth process using the crystal structure of the single-crystal semiconductor material of the device layer 12 as a growth template. As used herein, the term "source/drain region" means a doped region of semiconductor material that can function as either a source or a drain of a field-effect transistor. The gate structures of the field-effect transistors 20, 22 may function to self-align the concurrent epitaxial growth of the semiconductor material of the raised source/drain regions 34.

In an embodiment, the semiconductor material constituting the raised source/drain regions 34 may be silicon-germanium (SiGe) having a germanium content ranging from twenty percent (20%) to fifty percent (50%). In an embodiment, the raised source/drain regions 34 may be formed by a selective epitaxial growth process, such as low-pressure chemical vapor deposition, in which semiconductor material nucleates for epitaxial growth on semiconductor surfaces, but does not nucleate for epitaxial growth from insulator surfaces. The process for epitaxially growing silicon-germanium may involve a gas/vapor mixture including a silicon-based precursor, a carrier gas, hydrochloric acid vapor, and a germanium-based precursor (e.g., germane) under a given set of process conditions (e.g., substrate temperature, pressure, and gas flow).

The semiconductor material of the raised source/drain regions 34 may be doped with a concentration of a dopant that is effective to elevate its electrical conductivity. For example, the semiconductor material of the raised source/drain regions 34 may contain a p-type dopant selected from Group III of the Periodic Table (e.g., boron (B)) that produces p-type conductivity. The semiconductor material of the raised source/drain regions 34 may be doped in situ during epitaxial growth by adding a gas or vapor source of the dopant to the gas/vapor mixture. For example, the semiconductor material of the raised source/drain regions 34 may be doped with boron supplied from a boron precursor, such as diborane gas, added to the gas/vapor mixture.

The exterior of the raised source/drain regions 34 may be contoured with multiple surfaces 52, 54, 56 having a given arrangement relative to each other. The surface 52 may represent a topmost surface of the raised source/drain regions 34, and the surface 54 may be connected with the surface 56 by the surface 52. The surface 56 may be the closer to the gate structures of the field-effect transistors 20, 22 than either of the surfaces 52, 54. A direction that is normal to the surface 52 differs from a direction that is normal to the surface 54 and a direction that is normal to the surface 56. In an embodiment, the direction that is normal to the surface 54 and the direction that is normal to the surface 56 may be <111> directions, and the direction that is normal to the surface 52 may be a <100> direction. In that regard, the surfaces 54, 56 may be facets having an inclined orientation arising because of growth rates during the selective epitaxial growth process that are crystal-direction dependent.

Figure 3:
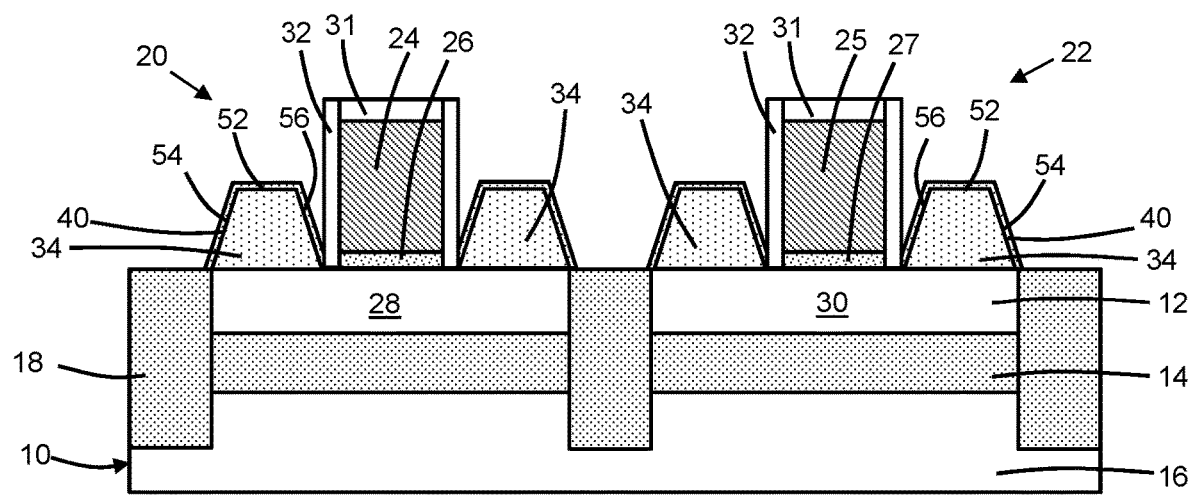
Figure 3A:
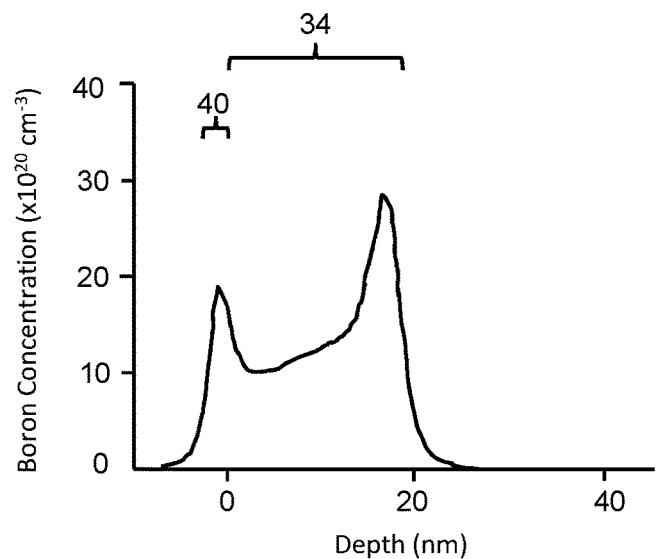
FIG. 3A is a graph showing a representative depth profile of the dopant concentration in a raised source/drain region and a surface layer on the raised source/drain region.

With reference to FIGS. 3, 3A in which like reference numerals refer to like features in FIG. 2 and at a subsequent fabrication stage, a surface layer 40 is formed over the epitaxial semiconductor material of the raised source/drain regions 34 and on the surfaces 52, 54, 56 of the raised source/drain regions 34. In an embodiment, the surface layer 40 may be conformal with a position-independent thickness. The surface layer 40 may be significantly thinner than the epitaxial semiconductor material of the raised source/drain regions 34. The surface layer 40 contains a dopant having the same conductivity type as the dopant contained in the epitaxial semiconductor material of the raised source/drain regions 34. In an embodiment, the raised source/drain regions 34 and the surface layer 40 may contain a p-type dopant. In an embodiment, the raised source/drain regions 34 and the surface layer 40 may contain boron as the p-type dopant.

The surface layer 40 and raised source/drain regions 34 are coextensive (i.e., share a boundary) over an interface defined by the surfaces 52, 54, 56 of the raised source/drain regions 34. As shown by the curve in FIG. 3A, the concentration of dopant (e.g., boron) in the surface layer 40 is greater than the concentration of dopant (e.g., boron) in a portion of the raised source/drain region 34 over a range of depths in the raised source/drain region 34 adjacent to the surface layer 40. In an embodiment, the range of depths may be a majority of the thickness of the raised source/drain region 34. The dopant concentration includes a peak near zero depth that reflects the enhanced concentration originating from the surface layer 40. Because the surface layer 40 is thin, the dopant concentration in the surface layer 40 may be approximately equal to the peak concentration. In an embodiment, the surface layer 40 may contain a peak concentration of boron (B) in a range of $1\times10^{21}$ cm$^{-3}$ to $1\times10^{22}$ cm$^{-3}$. The dopant concentration decreases to a minimum value at or near the interface between the surface layer 40 and the raised source/drain region 34. The dopant concentration then increases with increasing depth into the raised source/drain region 34. Although increasing in value with depth, the dopant concentration over this depth range in the raised source/drain region 34 is less than the peak dopant concentration in the surface layer 40. The dopant concentration may include another peak at the interface between the raised source/drain region 34 and the device layer 12.

In an embodiment, the surface layer 40 may be formed in situ in the deposition tool used to epitaxially grow the semiconductor material of the raised source/drain regions 34. For example, the epitaxial growth process used to form the epitaxial semiconductor material of the raised source/drain regions 34 may be continued under different process conditions to form the surface layer 40. As a specific example, the flows of the silicon-based precursor and germane may be halted after forming the epitaxial semiconductor material of the raised source/drain regions 34 while continuing the flow of the dopant precursor (e.g., diborane) and carrier gas. The dopant (e.g., boron) will deposit on the exposed surfaces 52, 54, 56 of the raised source/drain regions 34 and produce dopant pile-up generating the surface layer 40. For example, the surface layer 40 may include atoms of the dopant that adsorb on the exposed surfaces 52, 54, 56 of the raised source/drain regions 34 in one or more monolayers of the atoms, or in a fraction of a monolayer of the atoms.

In an embodiment, the surface layer 40 may be formed in situ by continuing the epitaxial growth process after increasing the flow rate of the dopant precursor (e.g., diborane) following the formation of the raised source/drain regions 34. For example, the surface layer 40 may be composed of epitaxial semiconductor material (e.g., silicon-germanium) that incorporates a higher content of the dopant (e.g., boron) than the semiconductor material (e.g., silicon-germanium) of the portion of the raised source/drain regions 34 adjacent to the interface with the surface layer 40. The dopant atoms are contained within the surface layer 40 with the given concentration.

In an embodiment, the surface layer 40 may be formed ex situ after the raised source/drain regions 34 are formed. For example, the surface layer 40 at the surfaces 52, 54, 56 may formed by implanting with ions containing the dopant under given implantation conditions (e.g., ion species, dose, kinetic energy, implantation angle). In an embodiment, the raised source/drain regions 34 may be implanted with ions containing boron under the given implantation conditions to provide a shallow implantation of the surfaces 52, 54, 56. The ions used to form the surface layer 40 may be generated from a suitable source gas and implanted into the raised source/drain regions 34 with the given implantation conditions using an ion implantation tool. Following implantation, the dopant atoms are contained within the surface layer 40 with the given concentration.

Figure 4:
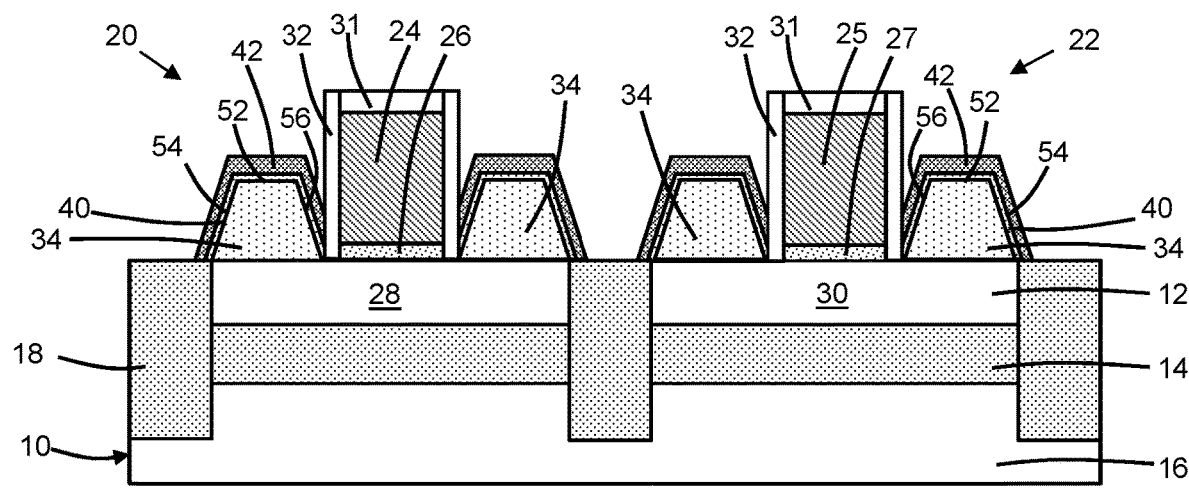

With reference to FIG. 4 in which like reference numerals refer to like features in FIG. 3 and at a subsequent fabrication stage, a capping layer 42 is formed over the surface layer 40 on the epitaxial semiconductor material of the raised source/drain regions 34. An epitaxial growth process may be used to form the semiconductor material of the raised source/drain regions 34. The single-crystal semiconductor material of the raised source/drain regions 34 may provide the crystal structure serving as a growth template for the epitaxial grown of the capping layer 42. In an embodiment, the semiconductor material constituting the capping layer 42 may be silicon (Si). In an embodiment, the semiconductor material constituting the capping layer 42 may be silicon-germanium (SiGe). In an embodiment, the capping layer 42 may be formed by a selective epitaxial growth process, such as low-pressure chemical vapor deposition. The epitaxial growth process may involve a gas/vapor mixture including a silicon-based precursor, a carrier gas, and vaporized hydrochloric acid under a given set of process conditions (e.g., substrate temperature, pressure, and gas flow). The surface layer 40 is arranged between each of the raised source/drain regions 34 and the associated capping layer 42.

In an embodiment, the semiconductor material of the capping layer 42 may be optionally doped during the epitaxial growth process with a concentration of a dopant, which may be effective to elevate the electrical conductivity of the material. For example, the semiconductor material of the capping layer 42 may contain a p-type dopant selected from Group III of the Periodic Table (e.g., boron (B)) that produces p-type conductivity. The semiconductor material of the capping layer 42 may be doped in situ during epitaxial growth by adding a gas or vapor source of the dopant, such as diborane gas.

Silicidation, middle-of-line (MOL) processing, and back-end-of-line (BEOL) processing follow to provide an interconnect structure coupled with the field-effect transistors 20, 22.

The surface layer 40 catalyzes the growth of the capping layer 42 from the surfaces 54 and 56 of the raised source/drain regions 34 such that the capping layer 42 on surfaces 54, 56 grows with a thickness that is greater than the thickness that would result in the absence of the surface layer 40. The presence of the surface layer 40 may elevate the overall epitaxial growth rate of the capping layer 42 in a crystal direction characterized by a low epitaxial growth rate. The thickness of the capping layer 42 on the surfaces 52, 54, 56 may be more isotropic in that that thickness of the capping layer 42 on surfaces 54 and 56 may be closer to the thickness of the capping layer 42 on the surface 52 than the relative thicknesses in the absence of the surface layer 40. In addition, adjustments to process parameters for promoting selective epitaxial growth process may have less of an effect on the formation of the capping layer 42.

Figure 5:
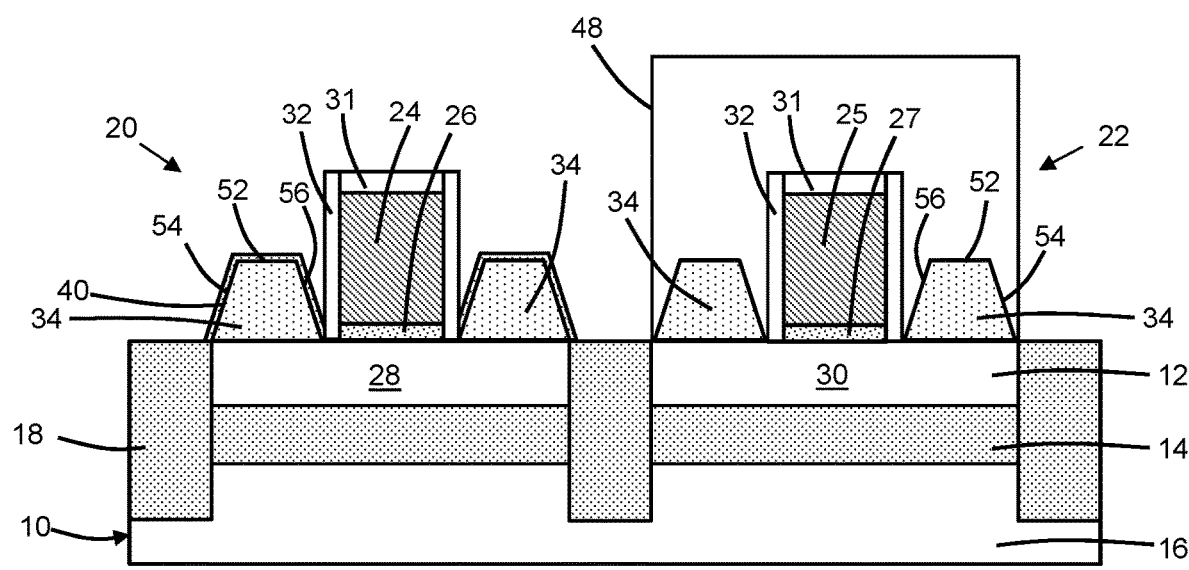
FIGS. 5-6 are cross-sectional views of a structure at successive fabrication stages of a processing method in accordance with an alternative embodiment of the invention.

With reference to FIG. 5 in which like reference numerals refer to like features in FIG. 2 and in accordance with alternative embodiments, the field-effect transistor 22 and its raised source/drain regions 34 may be covered and masked by a protective layer 48 during the process forming the surface layer 40. For example, the protective layer 48 may be a photoresist layer applied as an implantation mask. The surface layer 40 forms on the surfaces 52, 54, 56 of the raised source/drain regions 34 associated with field-effect transistor 20. However, the protective layer 48 blocks the surface layer 40 from forming on the surfaces 52, 54, 56 of the raised source/drain regions 34 associated with field-effect transistor 22 such that these surfaces 52, 54, 56 are free of the surface layer 40.

Figure 6:
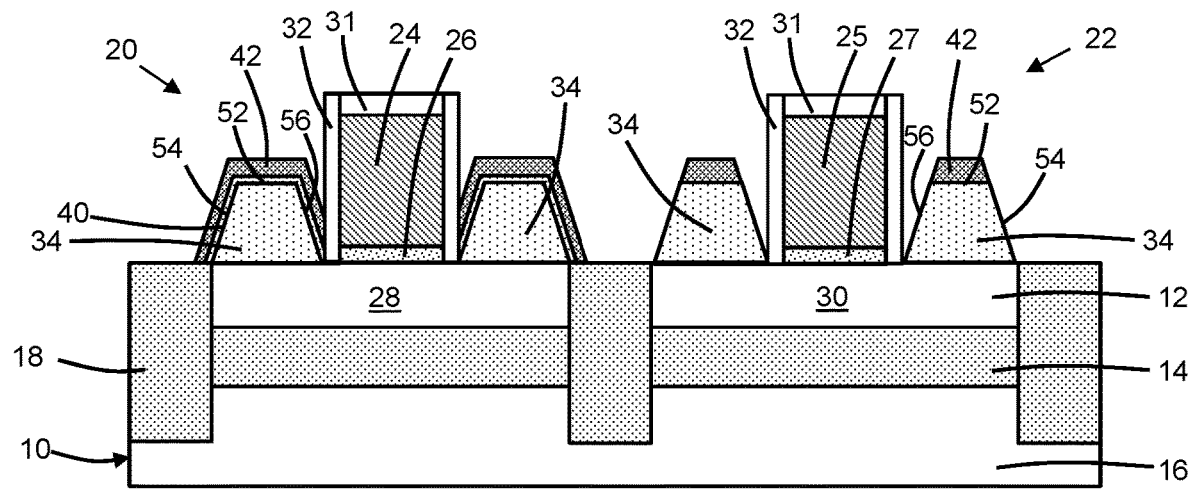

With reference to FIG. 6 in which like reference numerals refer to like features in FIG. 5 and at a subsequent fabrication stage, the capping layer 42 formed on the raised source/drain regions 34 associated with field-effect transistor 22 does not exhibit isotropic growth from the surfaces 52, 54, 56 because of the absence of the surface layer 40. Instead, the capping layer 42 epitaxially grows primarily from the surface 52 and epitaxial growth from the surfaces 54, 56 is suppressed due to differences in epitaxial growth rates that depend on growth direction. Specifically, the epitaxial growth rate of the capping layer 42 formed on the raised source/drain regions 34 associated with field-effect transistor 22 in a direction (e.g., the <100> direction) normal to the surface 52 is higher than the epitaxial growth rate in a direction (e.g., the <111> direction) normal to the surfaces 54, 56, which may include a negligible thickness of the capping layer 42. In contrast, the capping layer 42 formed on the surfaces 52, 54, 56 of the raised source/drain regions 34 associated with field-effect transistor 20 exhibits the isotropic epitaxial growth rate because of the presence of the surface layer 40.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a first epitaxial layer having a first surface and a second surface inclined relative to the first surface;
    a surface layer on the first surface and the second surface of the first epitaxial layer; and
    a second epitaxial layer arranged over the surface layer on the first surface and the second surface of the first epitaxial layer,
    wherein a portion of the first epitaxial layer defines a first interface with the surface layer, the portion of the first epitaxial layer contains a first concentration of a dopant, the surface layer contains a second concentration of the dopant that is greater than the first concentration of the dopant in the portion of the first epitaxial layer, the dopant is boron, the second concentration of the dopant includes a peak concentration at a second interface with the second epitaxial layer, the peak concentration ranges from $1\times10^{21}$ cm$^{-3}$ to $1\times10^{22}$ cm$^{-3}$, the second concentration of the dopant decreases from the peak concentration to a first minimum concentration at or near the first interface, and the first concentration of the dopant increases over a range of depths in the portion of the first epitaxial layer from the first interface.

2. The structure of claim 1 wherein the first epitaxial layer is silicon-germanium, and the second epitaxial layer is silicon or silicon-germanium.

3. The structure of claim 1 wherein the first epitaxial layer is a raised source/drain of a first field-effect transistor.

4. The structure of claim 3 further comprising:
    a second field-effect transistor including a raised source/drain region having a first surface and a second surface inclined relative to the first surface,
    wherein the first surface and the second surface of the raised source/drain region of the second field-effect transistor are free of the surface layer.

5. The structure of claim 1 wherein the first surface of the first epitaxial layer is oriented normal to a <100> crystal direction in a crystal structure of the first epitaxial layer, and the second surface of the first epitaxial layer is oriented normal to a <111> crystal direction in the crystal structure of the first epitaxial layer.

6. The structure of claim 1 wherein the first surface of the first epitaxial layer is oriented normal to a first crystal direction in a crystal structure of the first epitaxial layer, and the second surface of the first epitaxial layer is oriented normal to a second crystal direction in the crystal structure of the first epitaxial layer.

7. A method comprising:
    epitaxially growing a first epitaxial layer having a first surface and a second surface inclined relative to the first surface;
    forming a surface layer on the first surface and the second surface of the first epitaxial layer; and
    after forming the surface layer, epitaxially growing a second epitaxial layer arranged over the surface layer on the first surface and the second surface of the first epitaxial layer,
    wherein a portion of the first epitaxial layer defines a first interface with the surface layer, the portion of the first epitaxial layer contains a first concentration of a dopant, and the surface layer contains a second concentration of the dopant that is greater than the first concentration of the dopant in the portion of the first epitaxial layer, the dopant is boron, the second concentration of the dopant includes a peak concentration at a second interface with the second epitaxial layer, the peak concentration ranges from $1\times10^{21}$ cm$^{-3}$ to $1\times10^{22}$ cm$^{-3}$, the second concentration of the dopant decreases from the peak concentration to a first minimum concentration at or near the first interface, and the first concentration of the dopant increases over a range of depths in the portion of the first epitaxial layer from the first interface.

8. The method of claim 7 wherein forming the surface layer on the first surface and the second surface of the first epitaxial layer comprises:
    adsorbing the dopant on the first surface and the second surface to provide the second concentration of the dopant.

9. The method of claim 8 wherein the first epitaxial layer is silicon-germanium formed by an epitaxial growth process using a gas/vapor mixture comprising a silicon-based precursor, a germanium-based precursor, and a boron-containing precursor, and adsorbing the dopant on the first surface and the second surface to provide the second concentration of the dopant comprises:
    modifying the gas/vapor mixture to only include the boron-containing precursor.

10. The method of claim 7 wherein forming the surface layer on the first surface and the second surface of the first epitaxial layer comprises:
    epitaxially growing a third epitaxial layer on the first surface and the second surface of the first epitaxial layer that contains the second concentration of the dopant to form the surface layer.

11. The method of claim 10 wherein the first epitaxial layer is silicon-germanium formed by an epitaxial growth process using a gas/vapor mixture comprising a silicon-based precursor, a germanium-based precursor, and a boron-containing precursor, and adsorbing the dopant on the first surface and the second surface to provide the second concentration of the dopant comprises:

increasing a flow of the boron-containing precursor in the gas/vapor mixture when forming the surface layer.

12. The method of claim 7 wherein forming the surface layer on the first surface and the second surface of the first epitaxial layer comprises:

ion implanting the first surface and the second surface of the first epitaxial layer to provide the second concentration of the dopant and thereby form the surface layer.

13. The method of claim 7 wherein the first epitaxial layer is a raised source/drain of a first field-effect transistor.

14. The method of claim 13 further comprising:

epitaxially growing a raised source/drain region of a second field-effect transistor that includes a first surface and a second surface inclined relative to the first surface; and masking the first surface and the second surface of the raised source/drain region of the second field-effect transistor during formation of the surface layer on the first surface and the second surface of the first epitaxial layer, wherein the first surface and the second surface of the raised source/drain region of the second field-effect transistor are free of the surface layer.

15. The method of claim 7 wherein the first surface of the first epitaxial layer is oriented normal to a <100> crystal direction in a crystal structure of the first epitaxial layer, and the second surface of the first epitaxial layer is oriented normal to a <111> crystal direction in the crystal structure of the first epitaxial layer.

16. The method of claim 7 wherein the first surface of the first epitaxial layer is oriented normal to a first crystal direction in a crystal structure of the first epitaxial layer, and the second surface of the first epitaxial layer is oriented normal to a second crystal direction in the crystal structure of the first epitaxial layer.

* * * * *